United States Patent [19]

Nagai et al.

[11] 4,149,071

[45] Apr. 10, 1979

[54] LIGHT EMITTING ELEMENT DRIVE SYSTEM

[75] Inventors: Yasuo Nagai, Machida; Takashi Touge, Senzoku; Matazou Yamagata, Kawasaki; Noboru Sonetsuji, Yokohama, all of Japan

[73] Assignee: Fujitsu Limited, Japan

[21] Appl. No.: 793,362

[22] Filed: May 3, 1977

[30] Foreign Application Priority Data

May 25, 1976 [JP] Japan .................................. 51-60769

[51] Int. Cl.² ........................... H04B 9/00; G02F 1/00
[52] U.S. Cl. .................................... 250/199; 332/7.51
[58] Field of Search ........................ 250/199; 332/7.51

[56] References Cited

U.S. PATENT DOCUMENTS

4,075,474  2/1978  Straus .................................. 250/199

OTHER PUBLICATIONS

IEEE Journal of Quantum Electronics, vol. QE-9, No. 2, Feb. 1973, pp. 388–391.

*Primary Examiner*—Howard W. Britton
*Attorney, Agent, or Firm*—Staas & Halsey

[57] ABSTRACT

In a system in which a light emitting element such as a semiconductor laser, light emitting diode or the like is modulated directly by a drive current corresponding to an input modulation signal, the drive current is selected to correspond to an integrated value of the input modulation signal, thereby compensating for deterioration of the modulation characteristic based on a thermal effect in the light emitting element to obtain a desired optical output waveform.

33 Claims, 22 Drawing Figures

FIG. 9A
FIG. 9B
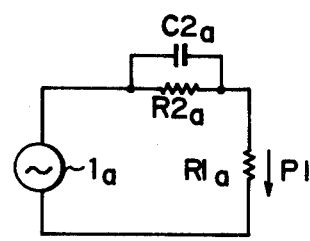
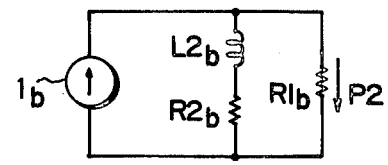
FIG. 10
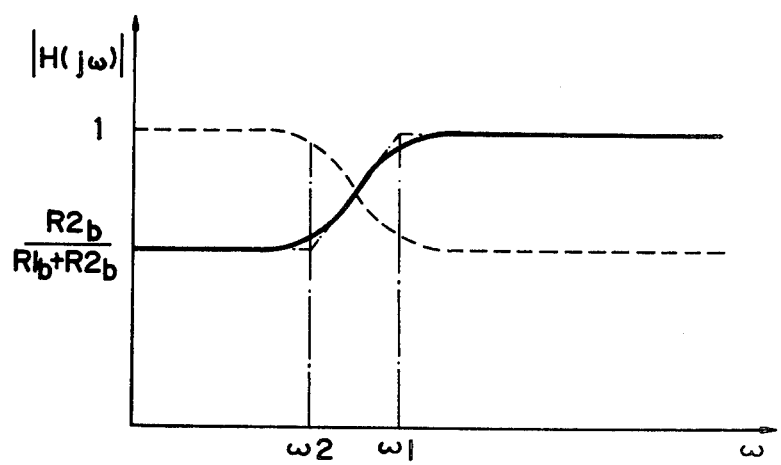

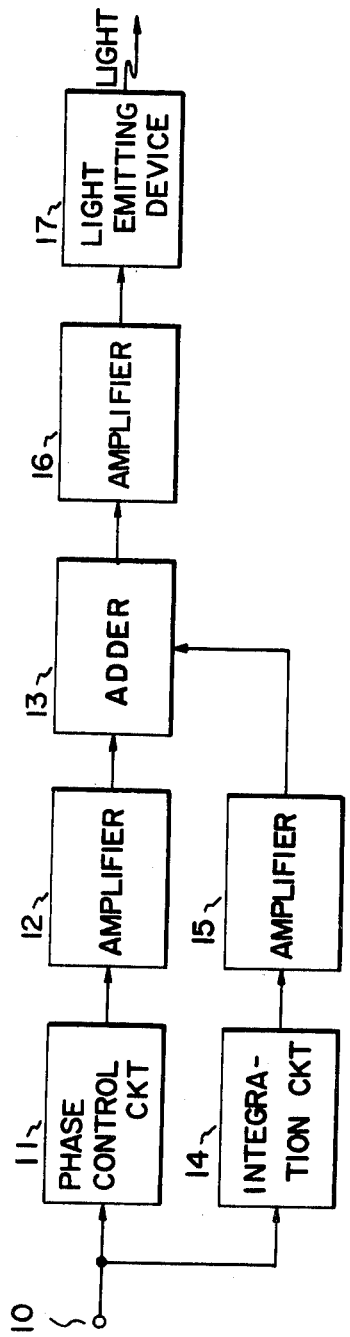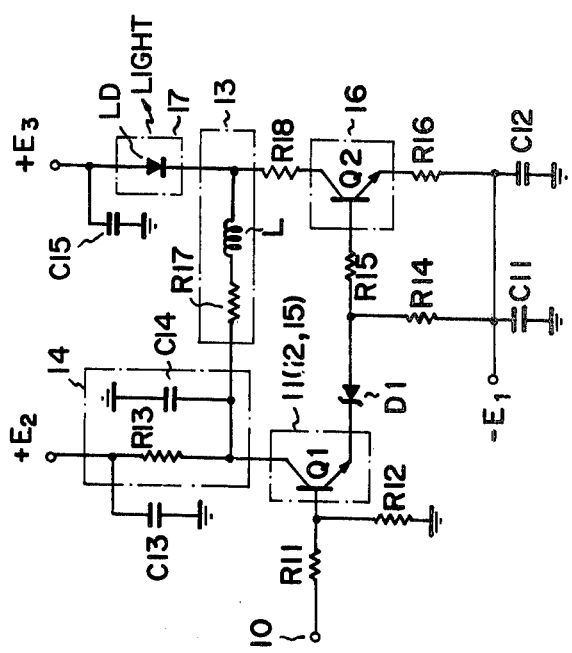
FIG. 14
FIG. 15

LIGHT EMITTING ELEMENT DRIVE SYSTEM

BACKGROUND OF THE INVENTION

1. Field of the Invention

This invention relates to a light emitting element drive system, and more particularly to a light emitting element drive system adapted to provide for improved modulation characteristic for directly modulating a semiconductor laser, light emitting diode or like light emitting element with a drive current.

2. Description of the Prior Art

Since the semiconductor laser, the light emitting diode and like light emitting elements have merit such as small size, high efficiency, easy direct modulation and so on, they are promising as an optical source of optical communication. At present, optical communication systems employing such a light emitting element are being developed. One problem of the light emitting element is a short lifetime, but there has recently been reported a semiconductor laser having a lifetime of several thousand hours and a light emitting diode of a longer lifetime. Further, it is reported that the lifetimes of a semiconductor laser and a light emitting diode in one estimate from the result of aging in a high temperature atmosphere can be longer than one hundred thousand hours and longer than one million hours, respectively.

Thus, the light emitting elements such as the semiconductor laser, light emitting diode and so on have been rapidly improved and, with such improvements in the light emitting elements, performance of an optical repeater and the like of an optical communication system, which are each formed with such a light emitting element, has also been enhanced, and quality requirements for them have also become severe. Especially, in the case of rivalry against a wire communication system employing a coaxial cable and so on, the optical communication system using light emitting elements, an optical cable, etc. must be constructed economically as much as possible by decreasing the number of parts used for the optical repeater and other devices so as to achieve reduced power consumption.

On the other hand, for modulating the light emitting element such as a semiconductor laser, light emitting diode or the like in response to an input modulation signal, it is necessary to sufficiently grasp the dynamic characteristic of the light emitting element. Heretofore, there have been proposed some solutions to deterioration of an optical waveform which is caused by phenomena such as relaxation oscillation and lasing delay time on the light emitting elements. These problems are encountered in the case of relatively high modulation speeds. But in the case of medium and lower modulation speeds, even if the peak value of a drive current is constant, the level of an optical output waveform does not remain unchanged. Especially in the case of obtaining a continuous optical pulse output, there is observed the phenomenon that its level gradually lowers, and in the case where the pulse width of the pulse drive current is relatively large, a sag occurs in the optical pulse waveform. Where such an optical pulse train is used, for example, in PCM communication, a visual display of received signal is degraded to result in increased error rate. In other words, transmission performance of the optical communication system is deteriorated.

SUMMARY OF THE INVENTION

An object of this invention is to provide a light emitting element drive system with which it is possible to obtain an optical output waveform faithfully corresponding to an input modulation signal.

Another object of this invention is to compensate for deteriorated modulation characteristic resulting from a thermal effect in the light emitting element.

Briefly stated, in the present invention, a drive current has the waveform that an input modulation signal is corrected by compensating means for compensating for a change in the optical output due to the thermal constant of the light emitting element such as a semiconductor laser, light emitting diode or the like, and the light emitting element is driven by the drive current to obtain an optical output waveform proportional to the input modulation signal waveform.

Other objects and effects of this invention will become apparent from the following description taken in conjunction with the accompanying drawings.

BRIEF DESCRIPTION OF THE DRAWINGS

FIGS. 9A and 9B are equivalent circuits explanatory of a step response of the light emitting element;

FIG. 10 is a graph showing a transfer function;

FIG. 14 is a block diagram showing another embodiment of this invention;

FIG. 15 is a specific operative circuit diagram of the embodiment exemplified in FIG. 14;

DESCRIPTION OF THE PREFERRED EMBODIMENTS

Figure 1:
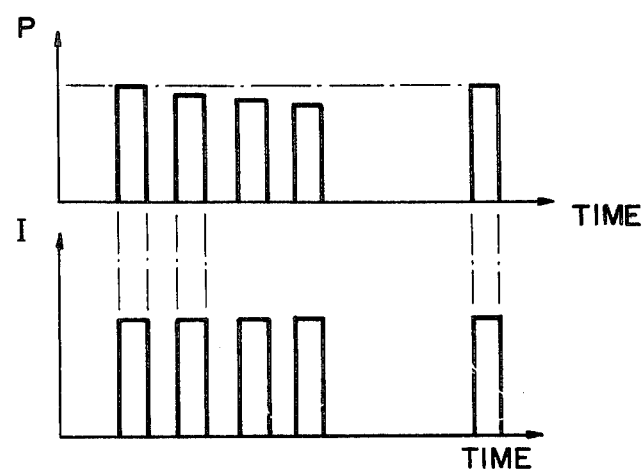
FIGS. 1 and 2 are graphs explanatory of the relationship of the optical output from a light emitting element to a drive current.
Figure 2:
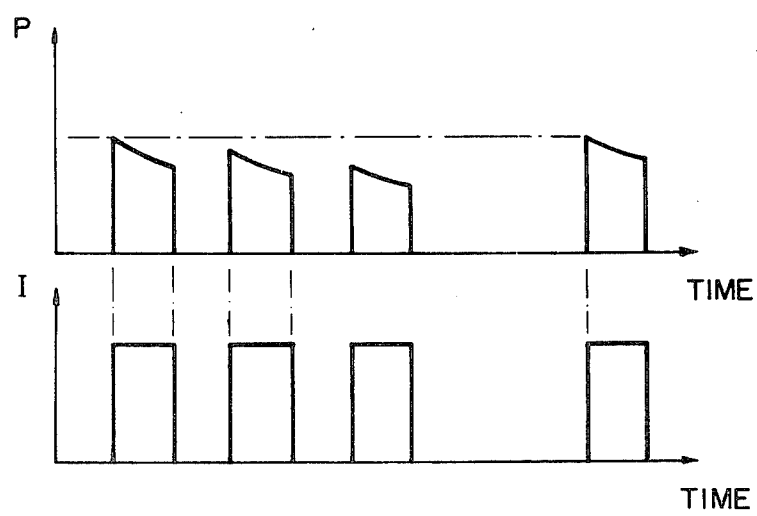

As shown in FIG. 1, even if the peak value of a drive current I is constant, when a light emitting element is repeatedly driven at short time intervals, its optical output P gradually lowers in level. Further, as depicted in FIG. 2, when the pulse width of the drive current I is relatively large, a sag occurs in the optical output P of the light emitting element, and if the light emitting element is repeatedly driven, the peak value of the optical output P also gradually reduces.

Figure 3:
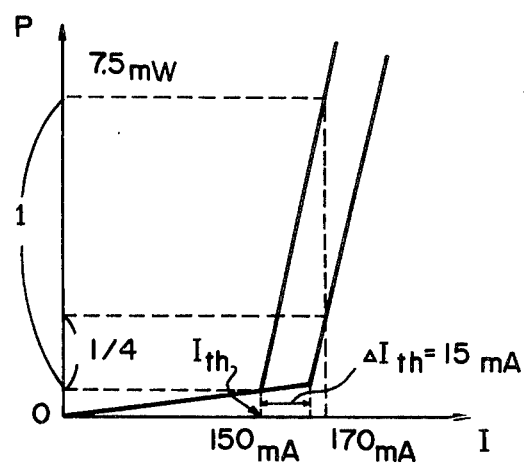
FIGS. 3 to 5 are graphs explanatory of the optical output characteristic of the light emitting element with respect to the drive current.

A semiconductor laser has such a drive current I vs. optical output P characteristic as shown in FIG. 3, and emits a light when supplied with the drive current I. According to our experimental results, a threshold current $I_{th}$ is given by the following equation:

$$I_{th} = I_{ths} \cdot \exp(T_j/T_0) \quad (1)$$

where $T_j$ is the temperature of the junction portion of the semiconductor laser, and $T_O$ and $I_{ths}$ are constants and with $T_o$ being in the approximate range of 80 to 120[° K.]. Further, $T_j$ is expressed by $$T_j = T_{j0} + \Delta T_j \quad (2)$$

where $\Delta T_j$ is a temperature rise of the junction portion. Accordingly, the equation (1) becomes as follows:

$$\begin{aligned} I_{th} &= I_{ths} \cdot \exp(\frac{T_{j0} + \Delta T_j}{T_0}) \\ &= I_{ths} \cdot \exp(\frac{T_{j0}}{T_0}) \cdot \exp(\frac{\Delta T_j}{T_0}) \\ &= I_{ths} \cdot \exp(\frac{T_{j0}}{T_0}) \cdot \{1 + \frac{\Delta T_j}{T_0} + \frac{1}{2!} \cdot (\frac{\Delta T_j}{T_0})^2 + \ldots\} \end{aligned}$$

Letting $T = 100[° K.]$ and $\Delta T_j = 10[° C.]$, yields $\Delta T_j/T_0 = 0.1$ and $(\Delta T_j/T_0)^2 = 0.01$. Accordingly, it follows that $$I_{th} \approx I_{ths} \cdot \exp(\frac{T_{j0}}{T_0}) \cdot (1 + \frac{\Delta T_j}{T_0})$$

Letting a threshold current at the initial time when the junction temperature is $T_{j0}$ be represented by $I_{th0}$, it follows that $$\begin{aligned} I_{th} &\approx I_{ths} \cdot \exp(\frac{T_{j0}}{T_0}) \cdot (1 + \frac{\Delta T_j}{T_0}) \\ &= I_{ths} \cdot \exp(\frac{T_{j0}}{T_0}) + I_{ths} \cdot \exp(\frac{T_{j0}}{T_0}) \cdot (\frac{\Delta T_j}{T_0}) \\ &= I_{th0} + I_{th0} \cdot (\frac{\Delta T_j}{T_0}) \end{aligned}$$

If $I_{th} = I_{th0} + \Delta I_{th}$, the following equation is obtained from the above equation:

$$\Delta I_{th} = I_{th0} \cdot (\Delta T_j/T_0) \quad (3)$$

where $$I_{th0} = I_{ths} \cdot \exp(T_{j0}/T_0)$$

Assuming that the threshold current $I_{th0}$ before the temperature change is 150 mA, that the temperature change $\Delta T_j$ is 10° C. and that $T_0 = 100°$ K., it follows from the equation (3) that $\Delta I_{th} = 15$ mA. The slope of the drive current I vs. optical output P characteristic above the threshold current does not change within the abovesaid temperature variation range. Accordingly, assuming that the drive current I is, for instance, 170 mA, that the optical output P is 7.5 mW and that an increase in the threshold current by a temperature change, $\Delta I_{th}$, is 15 mA, the optical output from the light emitting element, when considered except spontaneous emission light, reduces to about 25% of the optical output before the temperature change.

Figure 4:
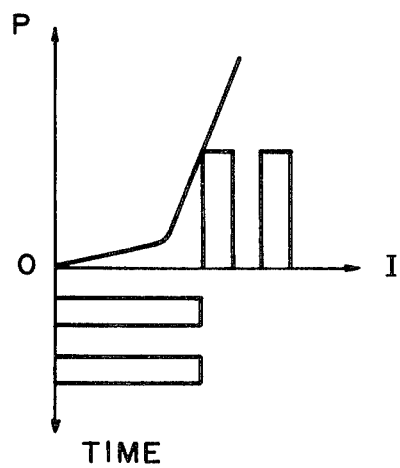

As illustrated in FIG. 4, in the case where pulses of the drive current I above the threshold current are supplied to a semiconductor laser to derive therefrom the optical output P in the form of a pulse light, if the forward voltage of the semiconductor laser is 1.8 V and if the peak value of a modulation drive current is 170 mA, the following power $$1.8 \times 0.170 = 0.306 \, [W]$$

is consumed at the junction portion of the semiconductor laser, as compared with the case where the drive current is zero.

The heat generated by the power dissipation is released to the outside. But, assuming that the thermal resistance is 30° C./W, the temperature rise $\Delta T_j$ of the junction portion is as follows:

$$\Delta T_j = 0.306 \times 30 = 9.2 \, [° C.]$$

With such a temperature rise of the junction portion, the optical output changes as much as approximately 75%, as described previously in connection with FIG. 3.

Figure 5:
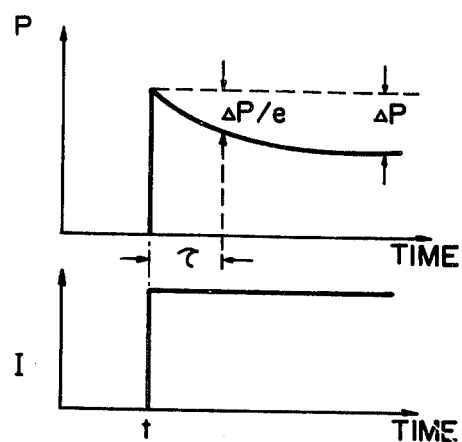

As shown in FIG. 5, the optical output P provided when a DC drive current I rising up at the moment t is supplied to a semiconductor laser, presents a simple exponentional response, and the time constant $\tau$ in this case is about 200 nS and the difference between the initial value and the convergent value of the optical output P is $\Delta P$.

Figure 6A:
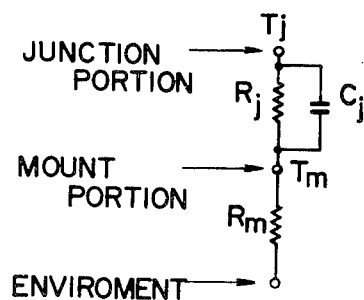
FIG. 6A is a thermal equivalent circuit of the light emitting element.
Figure 6B:
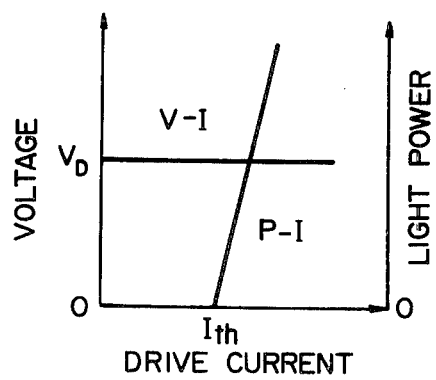
FIG. 6B is a graph showing the optical output and voltage characteristics of the light emitting element with respect to the drive current.

FIG. 6A shows a thermal equivalent circuit of a semiconductor laser, in which the temperature of the junction portion is indicated by $T_j$; the temperature of a mount portion of the semiconductor laser is designated by $T_m$; the thermal capacity and the thermal resistance between the junction portion and the mount portion are identified by $C_j$ and by $R_j$, respectively; and the thermal resistance between the mount portion and the air is represented by $R_m$. FIG. 6B shows a drive current I vs. optical output P characteristic curve (P—I) and a drive current I vs. voltage V characteristic curve (V—I) of the semiconductor laser. The characteristic curve (P—I) rises up at the threshold current $I_{th}$ and the characteristic curve (V—I) becomes nearly a straight line of a voltage $V_D$.

Figure 7:
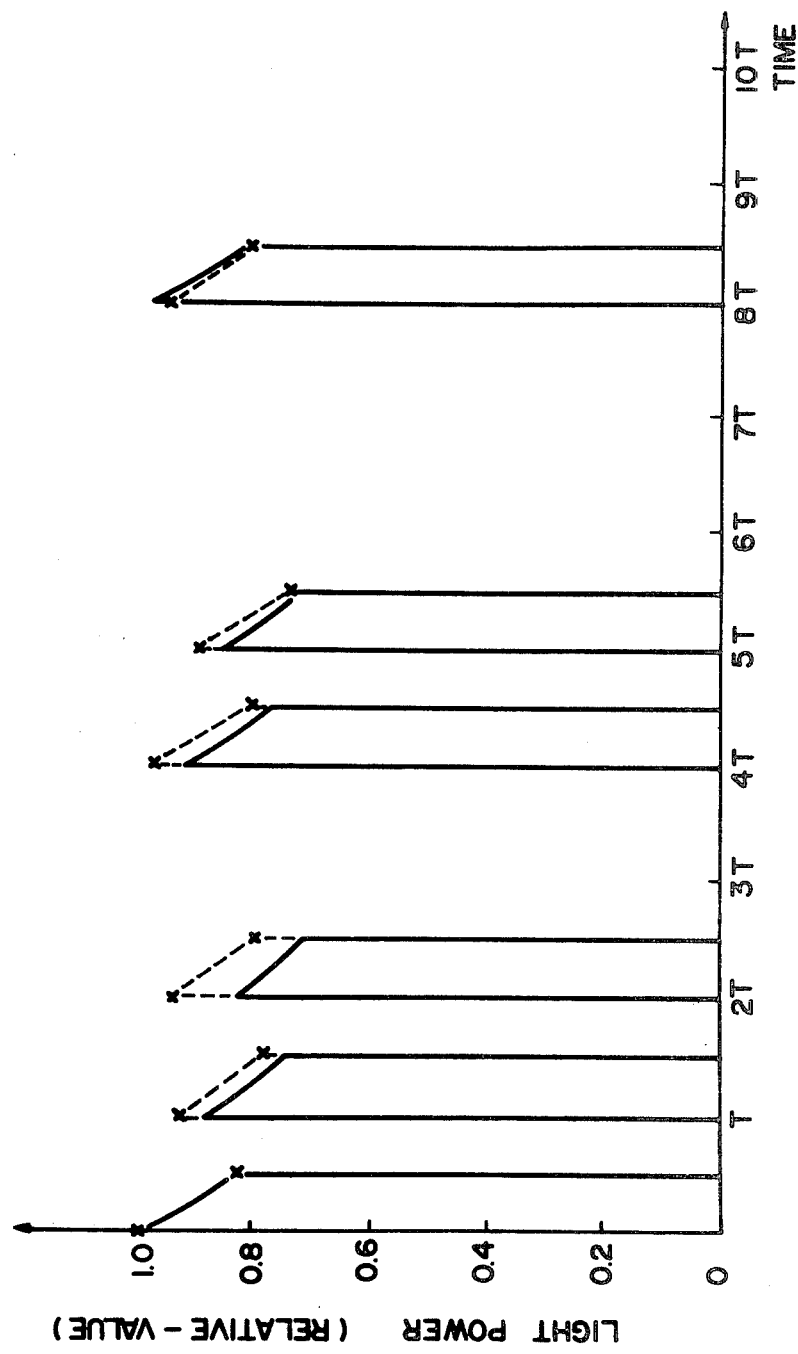
FIG. 7 is a graph showing calculated values and measured values of the optical output of the light emitting element with respect to the drive current.

In FIG. 7, there are shown calculated values (full lines) and measured values (broken lines of relative values of the optical output obtained when a drive current having a modulation speed of 6.3 megabits per second and a pulse width of duty 50% was supplied in a certain pattern to a semiconductor laser assumed to have the thermal equivalent circuit shown in FIG. 6A and the characteristics shown in FIG. 6B. The results of calculation of temperature variations of the junction portion are shown in FIG. 8.

Figure 8:
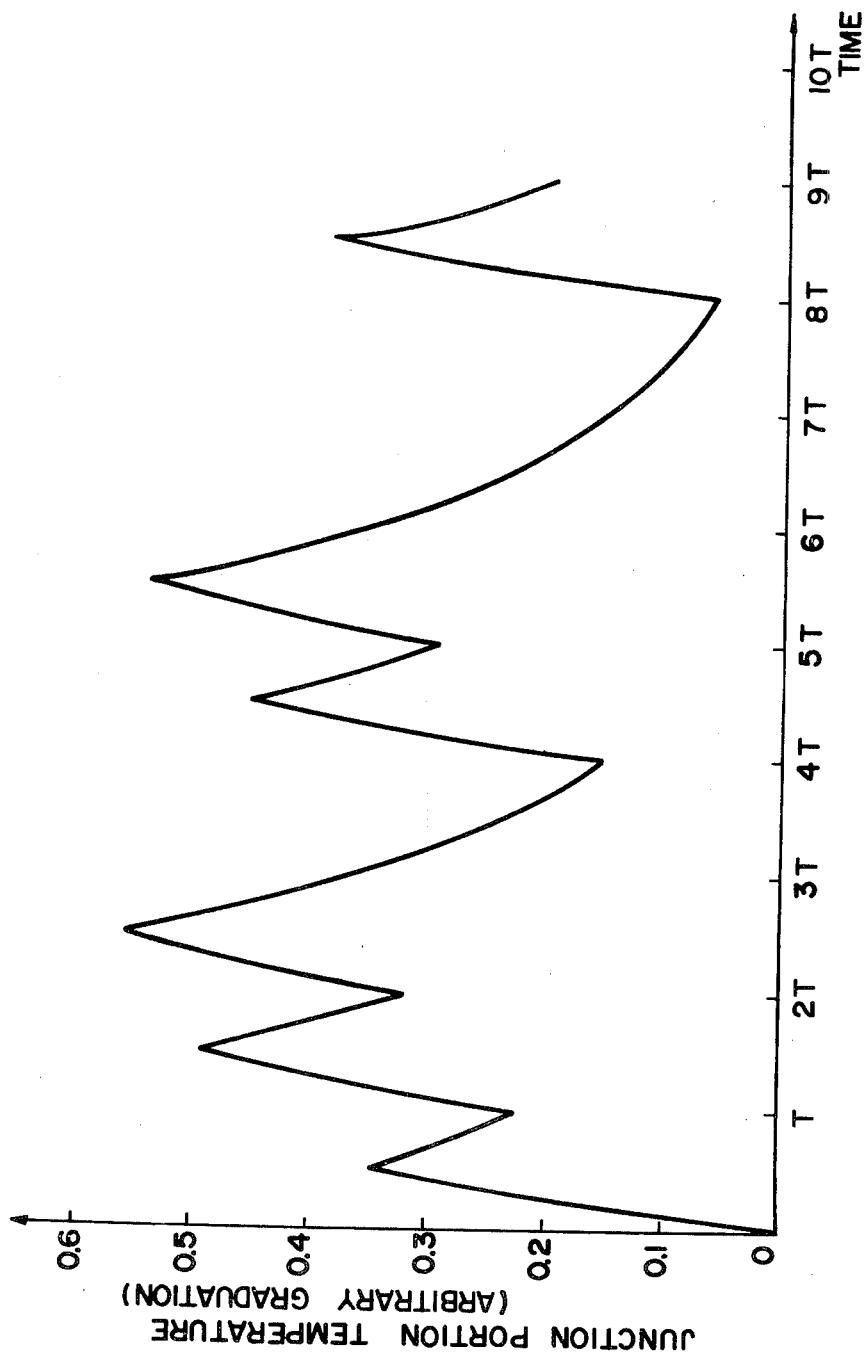
FIG. 8 is a graph showing calculated temperature variations of the junction portion of the light emitting element with respect to the drive current.

As illustrated in FIG. 7, the calculated values and the measured values are well coincident with each other, and it has been clarified from FIG. 8 that the exponential pattern effect is caused by the temperature change of the junction portion. Thus, it has been found that this pattern effect is due to the thermal effect based on a change in the modulation power, and it has been demonstrated that the model assumed in FIGS. 6A and 6B is correct. Further, the generation of sag in the optical output waveform, such as shown in FIG. 2, can also be explained with the thermal equivalent circuit having a thermal time constant. In other words, (1) when the modulation output varies, (2) the temperature of the junction portion changes (3) to raise the threshold values, (4) causing a change in the optical output. These changes in terms of time are dependent mainly upon the thermal resistance $R_j$ and the thermal capacity $C_j$ between the junction portion and the semiconductor laser mount portion. Accordingly, the abovesaid changes are determined by the thermal time constant dependent upon the thermal resistance $R_j$ and the thermal capacity $C_j$.

Then, in accordance with the present invention, the variation in the optical output by the thermal cause is suppressed by a control of the drive current, thereby to obtain a constant optical output. As depicted in FIG. 5, the optical output P when the rectangular drive current I is supplied to the semiconductor laser is that it gradually lowers from its initial value to the convergent value. An electric circuit representing the change in the waveform of the optical output becomes such as shown in FIGS. 9A and 9B. That is, in FIG. 9A, a resistor R1a is connected in series with a parallel circuit composed of a resistor R2a and a capacitor C2a, and supplied with a current P1 from a constant voltage source 1a, and a change in the current P1 corresponds to the change in the optical output P. In FIG. 9B, a resistor R1b is connected in parallel with a series circuit composed of an inductance L2b and a resistor R2b and a current P2 flowing in the resistor R1b from a constant current source 1b corresponding to the change in the optical output P.

The transfer function H(jω) of the current P1 or P2 flowing from the voltage source 1a or the current source 1b to the resistor R1a or R1b is given as follows:

$$H(j\omega) = k \cdot \frac{1 + j\omega T_2}{1 + j\omega T_1} \quad (4)$$

For FIG. 9A, $k = \frac{1}{R1a + R2a}$, $T_2 = C2a \cdot R2a$ and $T_1 = C2a \cdot \frac{R1a \cdot R2a}{R1a + R2a}$ and, for FIG. 9B, $k = \frac{R2b}{R1b + R2b}$, $T_2 = \frac{L2b}{R2b}$ and $T_1 = \frac{L2b}{R1b + R2b}$.

In either case, the relation $T_2 > T_1$ holds.

Figure 11A:
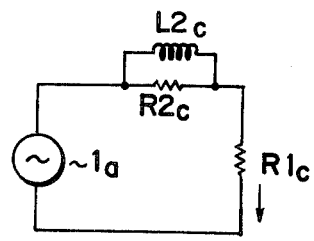
FIGS. 11A and 11B illustrate compensating circuits.
Figure 11B:
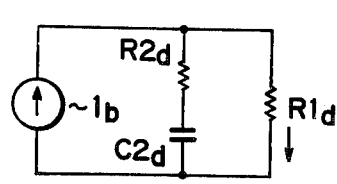

In FIG. 10, the solid line indicates schematically the characteristic of the abovesaid transfer function H(jω) and the abscissa represents angular frequency ω, $$\omega 1 = \frac{1}{T_1} = \frac{R1b + R2b}{L2b}$$

and $\omega 2 = 1/T_2 = R2b/L2b$. Such a characteristic can be compensated by adding a circuit having a characteristic as indicated by the broken line. The circuit of the characteristic indicated by the broken line is shown in FIGS. 11A and 11B, corresponding to FIGS. 9A and 9B, respectively. In FIGS. 11A and 11B, reference characters R1c and R2c indicate resistors; L2c designates an inductance; R1d and R2d identify resistors; and C2d denotes a capacitor.

Figure 12:
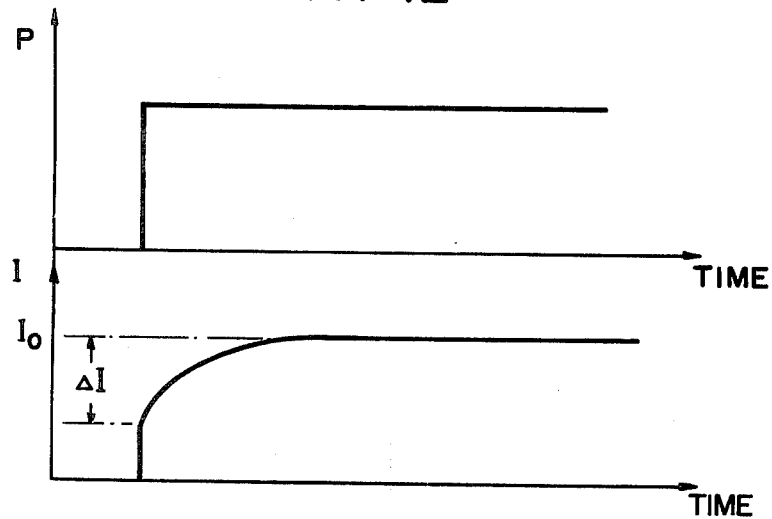
FIG. 12 is a graph explanatory of the relationship between a compensating drive current and the optical output.

The following will describe how to design the circuit of this invention in connection with the cases of FIGS. 9B and 11B. In order that the variation in the optical output P with respect to the drive current I such as shown in FIG. 5 may have such a characteristic as depicted in FIG. 12, it is sufficient only to select the initial value of the drive current I smaller than a convergent value $I_O$ by $\Delta I$. The ratio $\Delta P/P_O$ of a step change of value $\Delta P$ to the initial value $P_0$ of the optical output in FIG. 5 is as follows:

$$\frac{\Delta P}{P_0} = \frac{R2b}{R1b + R2b} \quad (5)$$

The time constant τ is as follows:

$$\tau = T_1 = \frac{1}{\omega 1} = \frac{L2b}{R1b + R2b} \quad (6)$$

Further, as is evident from FIG. 10, if R2b/(R1b + R2b) and ω1 are once determined, the constants for use in the compensation circuit are dependent upon the following formulae:

$$\frac{R1d}{R1d + R2d} = \frac{R2b}{R1b + R2b} = \frac{\Delta P}{P_0} \quad (7)$$

$$C2d(R1d + R2d) = \frac{L2b}{R1b + R2b} = \tau \quad (8)$$

That is, by measuring ΔP and τ in the step response of FIG. 5, relationship equations of the three constants of the compensation circuit following the formulae (7) and (8) are obtained.

Incapability of determining all the constants here is a natural consequence of the simulation involving different physical constants (the optical output and current), and does not interfere with the object of improving the modulation characteristic. Namely, the example of FIG. 11B indicates that a desired one of three unknown circuit constants can be determined by the designer at will; it can be determined as desired in accordance with other conditions of the circuit to be realized, and that the other constants may be determined by the formulae (7) and (8). Also, in FIG. 11A, the constants of the compensation circuit can be determined by exactly the same means as described above.

Figure 13A:
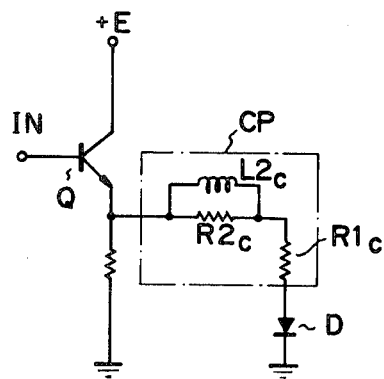
FIGS. 13A and 13B illustrate drive circuits embodying this invention.
Figure 13B:
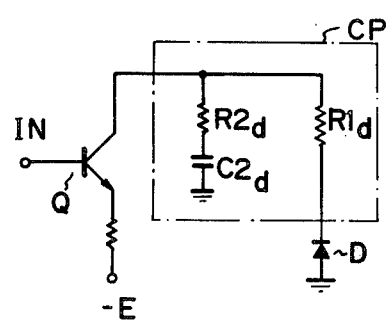

FIGS. 13A and 13B illustrate specific embodiments of the combinations of FIGS. 9A and 11A, and FIGS. 9B and 11B, respectively. Reference character IN indicates a modulation signal input terminal; Q designates a transistor; D identifies a light emitting element; and CP denotes a compensation circuit, which is identical with the structures of FIGS. 11A and 11B. Reference characters +E and −E represent power sources.

FIG. 13A illustrates the case where the light emitting element D is driven by a voltage source. The initial value of the drive current is controlled by the compensation circuit CP as shown in FIG. 12, by which the optical output P is provided corresponding to the waveform of a modulation signal applied to the input terminal IN. FIG. 13B shows the case where the light emitting element D is driven by a current source, and the modulation characteristic is improved as is the case with FIG. 13A.

FIG. 14 is a block diagram illustrating another embodiment of this invention. Reference numeral 10 indicates a modulation signal input terminal; 11 designates a phase shifter or such a phase control circuit; 12 identifies an amplifier; 13 denotes an adder; 14 represents an integration circuit; 15 and 16 show amplifiers; and 17 refers to a light emitting element (a semiconductor light source or light emitting device). A modulation signal such as a PCM signal or the like is applied from the input terminal 10 to the phase control circuit 11 and the integration circuit 14, and a phase and amplitude controlled signal and an integrated and amplified signal are added together in the adder 13. The resulting added output is amplified by the amplifier 16, and applied to the light emitting element 17.

The time constant of the integration circuit 14 is selected in agreement with the time constant which is dependent upon the thermal resistance $R_j$ and the thermal capacity $C_j$ of the thermal equivalent circuit shown in FIG. 6A. Such a time constant can be obtained easily by observing the step response of the optical output from the light emitting element 17 by means of an oscilloscope or the like.

FIG. 15 illustrates a specific operative circuit of the embodiment depicted in FIG. 14. Reference characters Q1 and Q2 indicate transistors; R11 to R18 designate resistors; C11 to C15 identify capacitors; L denotes a coil; D1 represents a diode; and LD shows a light emitting element. The functions of the phase control circuit 11 and the amplifiers 12 and 15 are accomplished by the transistor Q1, and the adder 13 is formed with the resistor R17, the coil L and connection wirings. The integration circuit 14 comprises the resistor R13 and the capacitor C14, and the amplifier 16 is formed with the transistor Q2.

Figure 16:
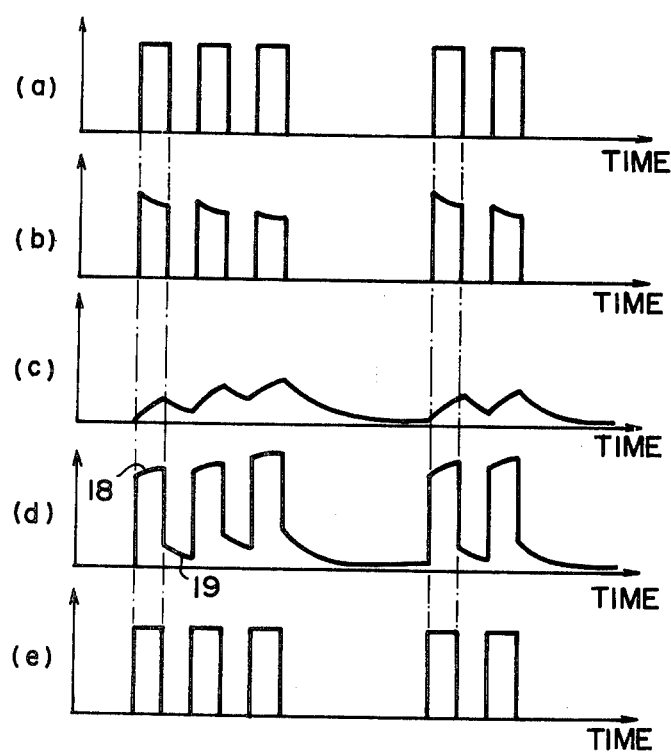
FIG. 16 is a waveform diagram explanatory of the operation of the embodiment of FIG. 14.

FIG. 16 is explanatory of the operation of the circuit shown in FIG. 15. Assuming that the modulation signal is the signal depicted in FIG. 16(a), the optical output, which is produced when the light emitting element is driven by a drive current proportional to the modulation signal waveform, takes the form shown in FIG. 16(b), as described previously with regard to FIGS. 1 and 2. The output resulting from integration of the abovesaid modulation signal by the integration circuit 14 is such as shown in FIG. 16(c). The output signal from the amplifier 12 amplifying the output from the phase control circuit 11, and the output signal from the amplifier 15 amplifying the output from the integration circuit 14, are added together in the adder 13 to provide such a signal waveform as shown in FIG. 16(d). This added output signal is amplified by the amplifier 16 to provide a drive current for the light emitting element 17.

The part 18 of the signal waveform shown in FIG. 16(d) is an inclined part which compensates for the sag of the output waveform of FIG. 16(b), and the part 19 is a part for averaging the temperature variations of the junction portion to suppress fluctuation of the optical output. By driving the light emitting element 17 with such a drive current, an optical output shown in FIG. 16(e) is obtained.

Figure 17:
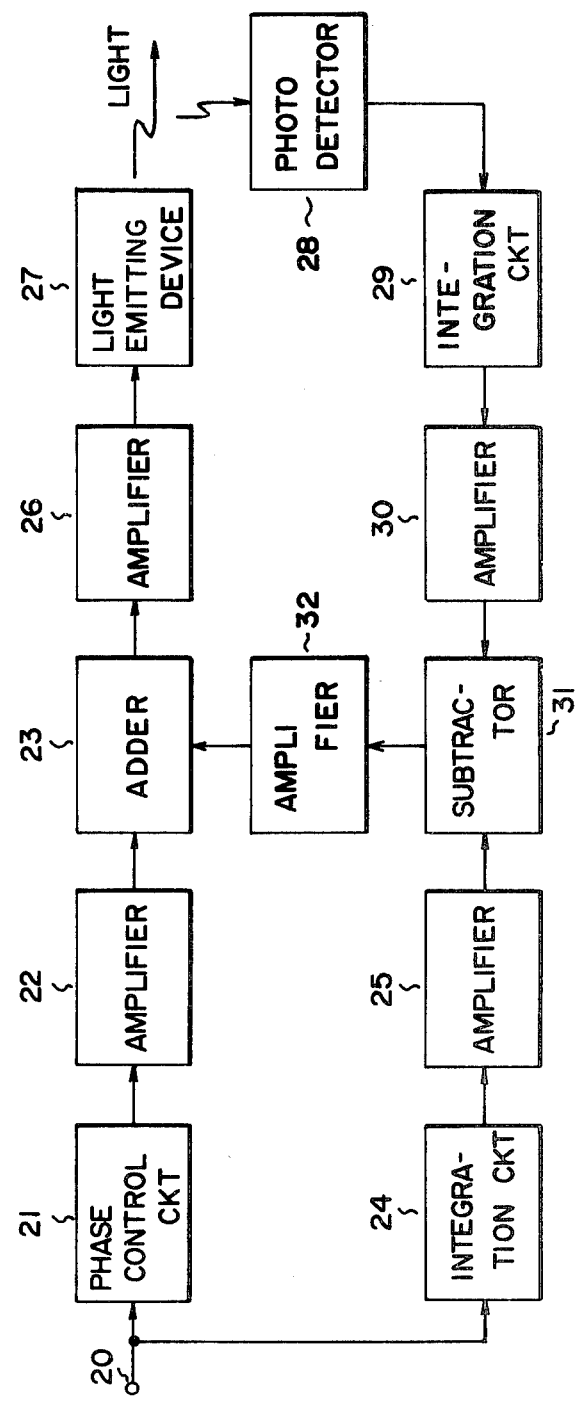
FIG. 17 is a block diagram illustrating another embodiment of this invention.

FIG. 17 illustrates in block form another embodiment of this invention. Reference numeral 20 indicates a modulation signal input terminal; 21 designates a phase shifter or such a phase control circuit; 22, 25, 26, 30 and 32 identify amplifiers; 23 denotes an adder; 24 represents an integration circuit; 27 shows a light emitting element; 28 refers to a light receiving element (an optical detector or a light detector); 29 indicates an integration circuit; and 31 designates a subtractor. The present embodiment is provided by adding a negative feedback loop for stabilizing the embodiment of FIG. 14 for stabilizing the optical output. One portion of the optical output from the light emitting element 27 is directed to the light receiving element 28, the output from which is integrated by the integration circuit 29. The time constant of the integration circuit 29 is selected to be sufficiently larger than the time constant of the integration circuit 24 for integrating the modulation signal. The integrated output from the integration circuit 29 is amplified by the amplifier 30, and then applied to the subtractor 31 to obtain the difference between the abovesaid amplified input and a signal from the amplifier 25 amplifying the modulation signal integrated output. The difference signal thus obtained is amplified by the amplifier 32, and then applied to the adder 23. With such a negative feedback loop, the optical output from the light emtting element 27 is stabilized. Moreover, by integrating the modulation signal and driving the light emitting element 27 with a signal waveform wherein the integrated output is added to the modulation signal, the modulation characteristic can be improved.

Figure 18:
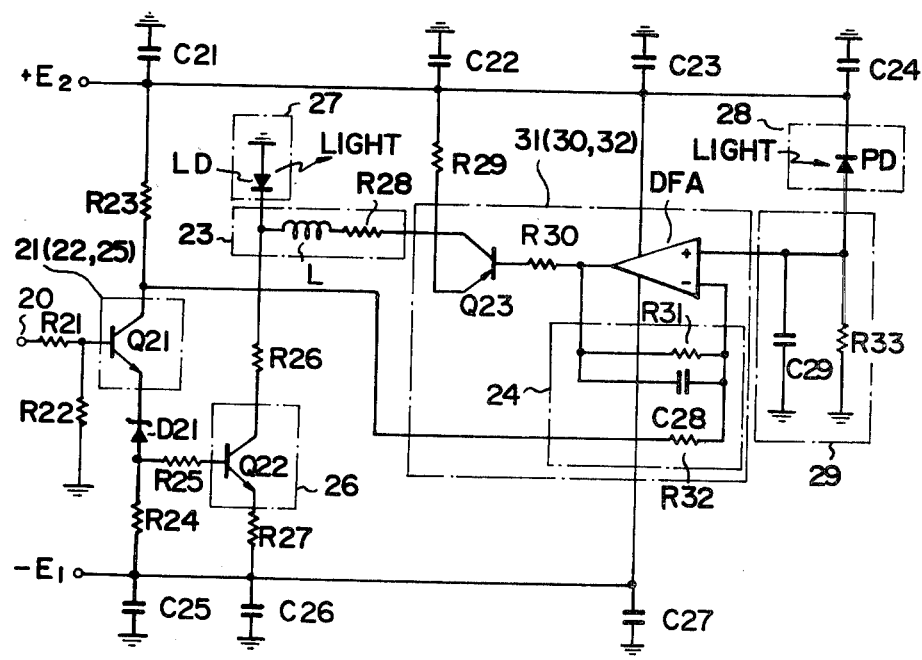
FIG. 18 is a specific operative circuit diagram of the embodiment depicted in FIG. 17.

FIG. 18 shows a specific circuit construction of the embodiment depicted in FIG. 17. Reference characters R21 to R33 indicate resistors; C21 to C29 designate capacitors; Q21 to Q23 identify transistors; DFA denotes a differential amplifier; LD represents a light emitting element; PD shows a photodiode or like light receiving element; D21 refers to a diode; and L indicates a coil. The functions of the phase control circuit 21 and the amplifiers 22 and 25 are all performed by the transistor Q21, and the amplifier 26 for supplying the drive current to the light emitting element LD is formed with the transistor Q22. The adder 23 is made up with the coil L, the resistor R28 and connection wirings. The integration circuit 24 is formed with the resistors R31 and R32 and the capacitor C28. The subtractor 31 and the amplifiers 30 and 32 are respectively constituted with the transistor Q23, the differential amplifier DFA, the resistors R30 to R32 and the capacitor C28. The integration circuit 29 is composed of the resistor R33 and the capacitor C29. The light receiving element PD is disposed in the vicinity of the light emitting element LD, and supplied with one portion of the optical output from the light emitting element LD. Where the light emitting element LD is a semiconductor laser, it may be disposed so that an optical output on the opposite side from the optical output is incident upon the light receiving element PD.

The light output of semiconductor lasers pulsed at high frequency is known to be distorted due to delay time for the onset of lasing. This is shown by variation in light output waveform caused by superposing a DC current on the modulation current. (For example, IEEE Journal of Quantam Electronics, Vol. QE-9, February 1973, pp. 388–91.) Accordingly, although the light emitting element is driven by a drive current compensated corresponding to the integrated value of the modulation signal in the foregoing embodiments, it is also possible to employ a drive current upon which is superimposed a DC signal of a suitable amplitude for compensating for this distortion due to high-frequency modulation.

As has been described in the foregoing, an optical output waveform which is proportional to an input modulation signal waveform can be obtained by controlling the drive current for a light emitting element using a semiconductor such as a semiconductor laser, a light emitting diode or the like in such a manner as to compensate for a change in the optical output caused by the thermal time constant of the light emitting element. Accordingly, the modulation characteristic in the system of modulating the light emitting element directly by the drive current can be improved.

It will be apparent that many modifications and variations may be effected without departing from the scope of novel concepts of this invention.

What is claimed is:

1. A system for driving a light emitting semiconductor element to achieve an optical output coinciding with a desired optical output, comprising:

means for receiving an input modulation signal corresponding to said desired optical output;

said light emitting semiconductor element having a thermal time constant which causes variation of said optical output so as to cause said optical output to differ from said desired optical output;

said system further comprising means for converting said input modulation signal into a signal corresponding to a composite signal composed of said input modulation signal and its integrated value so as to compensate for the variation of said optical output due to said thermal time constant of said light emitting semiconductor element, whereby to provide said optical output coinciding with said desired optical output.

2. A light emitting element drive system according to claim 1, said system further including means connected to said receiving means for phase controlling said input modulation signal prior to said converting of said input modulation signal.

3. A light emitting element drive system according to claim 2, said system further comprising amplifying means connected to said phase controlling means for amplifying said phase controlled input modulation signal prior to adaptation of said input modulation signal by said adapting means.

4. A light emitting element drive system according to claim 1, wherein said adapting means comprises:
means for integrating said input modulation signal to provide an integrated value thereof,
means for combining said input modulation signal with said integrated value thereof to obtain a composite signal, and
means for superimposing a DC signal on said composite signal.

5. A light emitting element drive system according to claim 4, said system further including means connected to said receiving means for phase controlling said input modulation signal prior to adaptation of said input modulation signal by said adapting means.

6. A light emitting element drive system according to claim 5, said system further comprising amplifying means connected to said phase controlling means for amplifying said phase controlled input modulation signal prior to adaptation of said input modulation signal by said adapting means.

7. A light emitting element drive system according to claim 1, wherein said system includes a current source for receiving said input modulation signal and for driving said light emitting semiconductor element in response thereto, and wherein said adapting means is connected between said current source and said light emitting semiconductor element, and comprises a resistor connected in series with said light emitting semiconductor element, and a series circuit of a resistor and a capacitor connected in parallel with said series circuit of said light emitting element and said resistor.

8. A light emitting element drive system according to claim 7, said system further including means connected to said receiving means for phase controlling said input modulation signal prior to adaptation of said input modulation signal by said adapting means.

9. A light emitting element drive system according to claim 8, said system further comprising amplifying means connected to said phase controlling means for amplifying said phase controlled input modulation signal prior to adaptation of said input modulation signal by said adapting means.

10. A light emitting element drive system according to claim 1, wherein said system includes a voltage source for receiving said input modulation signal and for driving said light emitting semiconductor element, and wherein said adapting means is connected between said voltage source and said light emitting element, and comprises a first circuit of a resistor and an inductance, connected in parallel, and a second circuit, of a resistor connected in series with said light emitting semiconductor element, said second circuit being connected in series with said first circuit.

11. A light emitting element drive system according to claim 10, said system further including means connected to said receiving means for phase controlling said input modulation signal prior to adaptation of said input modulation signal by said adapting means.

12. A light emitting element drive system according to claim 11, said system further comprising amplifying means connected to said phase controlling means for amplifying said phase controlled input modulation signal prior to adaptation of said input modulation signal by said adapting means.

13. A light emitting element drive system according to claim 1, wherein said adapting means comprises:
means for integrating said input modulation signal to provide an integrated value thereof, and
means for combining said input modulation signal with said integrated value thereof.

14. A light emitting element drive system according to claim 13, wherein said optical output from said light emitting element has a step response thereof characterized by a given time constant, and wherein said input modulation signal is integrated by said integrating means in accordance with said given time constant.

15. A light emitting element drive system according to claim 13, said system further including means connected to said receiving means for phase controlling said input modulation signal prior to adaptation of said input modulation signal by said adapting means.

16. A light emitting element drive system according to claim 15, said system further comprising amplifying means connected to said phase controlling means for amplifying said phase controlled input modulation signal prior to adaptation of said input modulation signal by said adapting means.

17. A light emitting element drive system according to claim 1,
said system including detecting means for detecting said optical output from said light emitting element and providing a detection signal corresponding thereto, and
means for integrating said detection signal to obtain an integrated value of said detection signal;
said adapting means comprising:
means for integrating said input modulation signal to obtain an integrated value of said input modulation signal,
means for subtracting said integrated value of said input modulation signal and said integrated value of said detection signal to obtain a difference signal, and
means for combining said input modulation signal and said difference signal to provide a drive signal for driving said light emitting semiconductor diode.

18. A light emitting element drive system according to claim 17, wherein the means for integrating said input modulation signal integrates said input modulation signal in accordance with a first time constant, and said means for integrating said detection signal integrates said detection signal in accordance with a second time constant, said first time constant being selected to be larger than the second time constant.

19. A light emitting element drive system according to claim 17, said system further including means connected to said receiving means for phase controlling said input modulation signal prior to adaptation of said input modulation signal by said adapting means.

20. A light emitting element drive system according to claim 19, said system further comprising amplifying means connected to said phase controlling means for amplifying said phase controlled input modulation signal prior to adaptation of said input modulation signal by said adapting means.

21. A control circuit for driving a light emitting semiconductor element comprising:
means for receiving within said control circuit an input modulation signal;
means for obtaining a compensating signal corresponding to a composite signal composed of said input modulation signal and its integrated value so as to compensate for variation in optical output of said element due to its thermal constant; and,
means for applying said compensating signal within said system to cause the value of said optical output to correspond to the value of said input modulation signal within the range of operation of said element.

22. The control circuit of claim 21 further comprising means for applying to said element a DC signal of a suitable magnitude to decrease the lasing delay time.

23. The control circuit of claim 21, wherein said input modulation signal comprises a current source, and wherein said compensating signal means is connected between said source and said element and comprises a first circuit of a resistor connected in series with said element and a second circuit of a second resistor and a capacitor connected in series, said first series circuit being connected in parallel to said current source.

24. The control circuit of claim 21 wherein said input modulation signal comprises a voltage source and wherein said compensating signal means is connected between said source and said element and comprises a first circuit of a first resistor and an inductance connected in parallel and a second circuit of a second resistor connected in series with said element, said first parallel circuit being connected in series with said second series circuit.

25. The control circuit of claim 21, wherein the change in said optical output is proportional to the change in value of said input modulation signal, for values of said input modulation signal above a threshold value for producing said optical output.

26. The control circuit of claim 21, wherein said compensating signal means comprises means for integrating said input modulation signal.

27. The control circuit of claim 26 wherein said means for integrating has an integration time constant approximately equal to the time constant of a step response of said optical output.

28. The control circuit of claim 26, wherein said receiving means further comprises a phase control circuit, and wherein said compensating means further comprises an adding means for summing the outputs from said integrating means and from said means for receiving within said control circuit said input modulation signal.

29. The control circuit of claim 28, further comprising means for amplifying the outputs of:
said phase control circuit, and
said integrating means; and further wherein
said phase control circuit and said amplifying means comprise a transistor; and
said adding means comprises an inductance in series with a resistor.

30. The control circuit of claim 21 wherein said compensating signal means further comprises:
means for intercepting a portion of said optical output, said intercepting means having an output signal value corresponding to the value of said intercepted optical output;
means for integrating said output signal;
means for integrating said input modulation signal; and,
subtracting means for forming the difference between said integrated output signal and said integrated input modulation signal.

31. The control circuit of claim 30, wherein said means for integrating said output signal has an integration time constant sufficiently larger than the time constant for said integration of said input modulation signal to improve said compensation of said optical output.

32. The control circuit of claim 30 wherein said receiving means further comprises a phase control circuit and wherein said compensating means further comprises adding means connected to form the sum of the outputs from said means for integrating said input modulation signal and from said subtracting means.

33. The control circuit of claim 32 further comprising amplifying means for amplifying the outputs of:
said phase control circuit;
said means for integrating said input modulation signal;
said means for integrating said output signal; and
said subtracting means; and further wherein:
said phase control circuit and said means for amplifying said outputs from said phase control circuit and from said means for integrating said input modulation signal comprises a transistor;
said adding means comprises an inductance in series with a resistor; and
said means for subtraction and for amplifying said outputs from said means for integrating said output signal and said subtraction means comprises a resistor, a transistor and a differential amplifier connected with said means for integrating said input modulation signal.

* * * * *